United States Patent
Nguyen

(10) Patent No.: US 6,455,942 B1
(45) Date of Patent: Sep. 24, 2002

(54) METHOD AND APPARATUS FOR STRAPPING A PLURALITY OF POLYSILICON LINES IN A SEMICONDUCTOR INTEGRATED CIRCUIT DEVICE

(75) Inventor: Hung Q. Nguyen, Fremont, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/930,811

(22) Filed: Aug. 15, 2001

(51) Int. Cl.[7] .................. H01L 23/528; H01L 23/522; H01L 23/532
(52) U.S. Cl. .................. 257/775; 257/754; 257/773
(58) Field of Search ................... 257/773, 775, 257/754

(56) References Cited

U.S. PATENT DOCUMENTS 5,933,725 A * 8/1999 Kirsch et al. ................ 438/239
6,243,311 B1 * 6/2001 Keeth .......................... 257/208

FOREIGN PATENT DOCUMENTS

JP        08330536 A   * 12/1996   ......... H01L/27/108

* cited by examiner

*Primary Examiner*—Allan R. Wilson
(74) *Attorney, Agent, or Firm*—Gray Cary Ware & Freidenrich LLP

(57) ABSTRACT

A method and apparatus for partially strapping a plurality of polysilicon lines, each having a first end and second end, uses a metal line having a plurality of spaced apart metal segments that are collinear with each metal segment partially strapping a different one of the polysilicon lines. The metal segments are arranged from the first end to the second end with the signals propagating from the second end to the first end with each metal line having a length of x $$x = \frac{L}{n+1/3}$$

and with a metal line at the second end having a length of ⅓X where L is the length between the first end and the second end and n is the number of metal lines.

13 Claims, 2 Drawing Sheets

METHOD AND APPARATUS FOR STRAPPING A PLURALITY OF POLYSILICON LINES IN A SEMICONDUCTOR INTEGRATED CIRCUIT DEVICE

TECHNICAL FIELD

The present invention relates to a plurality of metal lines each of which partially straps a different one of a plurality of polysilicon lines in a semiconductor integrated circuit device.

BACKGROUND OF THE INVENTION

Semiconductor integrated circuit devices are well known in the art. In particular, in the field of memory devices, including both volatile (such as DRAM or SRAM) as well as nonvolatile (such as FLASH), a plurality of polysilicon lines are used as row lines to access various memory cells. Because these row lines are made out of polysilicon, they tend to have higher resistivity than conductors made out of metal. Thus, metal lines are used to "strap" various polysilicon lines. By strapping it is meant to connect a metal line in parallel with the polysilicon row line to reduce the resistivity of the polysilicon row line.

As the scale of integration increases, i.e., the smallest dimension of a feature in a semiconductor integrated circuit device decreases, the width of the polysilicon lines will also decrease. However, the scale of integration for metal lines has not kept pace at the same rate as the scale of integration for other features such as the polysilicon lines. In other words, the width of the metal strapping lines has not been reduced at the same rate as the width of the polysilicon lines.

Thus, a metal line having a width greater than a plurality of polysilicon lines, may be segmented into a plurality of metal segments with each metal segment used to strap a different one of the polysilicon lines. The present invention deals with the optimal position for the strapping of such a partial strapped polysilicon line.

SUMMARY OF THE INVENTION

In the present invention, a semiconductor integrated circuit device comprises a semiconductor substrate with a plurality of circuits therein. A plurality of substantially parallel, laterally adjacent spaced apart polysilicon lines are insulated from the substrate and interconnect the plurality of circuits. Each of the plurality of polysilicon lines has a first end and a second end and has substantially the same length between the first end and the second end with electrical signals traversing from the second end to the first end. A plurality of substantially collinear metal lines are spaced apart from the plurality of polysilicon lines. Each of the plurality of metal lines electrically connects to a different one of the plurality of polysilicon lines. The metal lines are arranged from the first end to the second end with each metal line having a length of $$X = \frac{L}{n + 1/3}.$$

The metal line at the second end has a length of ⅓x where L is the length between the first end and the second end and n is the number of metal lines.

DETAILED DESCRIPTION OF THE INVENTION

Figure 1:
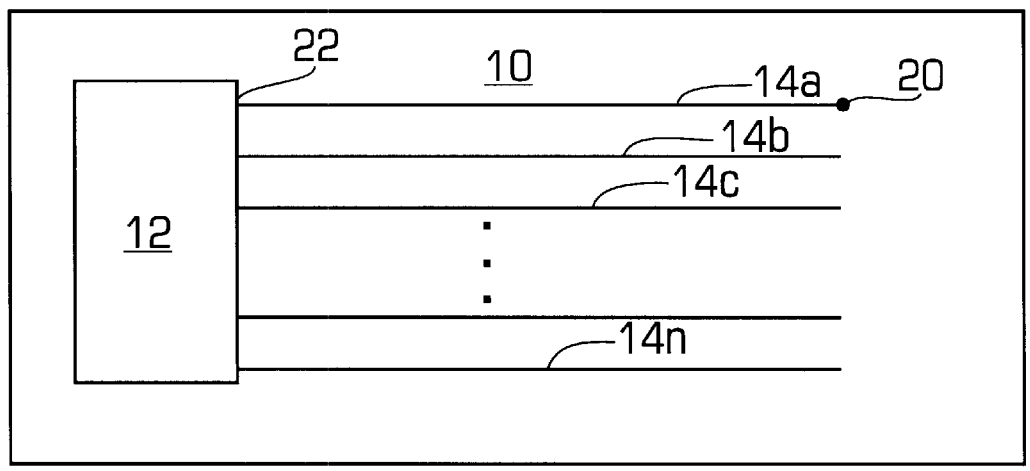
FIG. 1 is a top view of an integrated circuit device with a plurality of substantially parallel polysilicon lines to which the method and apparatus of the present invention can be applied.

Referring to FIG. 1, there is shown a top level view of a semiconductor integrated circuit device 10 to which the method and apparatus of the present invention can be applied. The semiconductor integrated circuit device 10 comprises a semiconductor substrate in which a plurality of circuits 12 are formed. A plurality of substantially parallel laterally adjacent spaced apart polysilicon lines 14(a–n) are formed above and insulated from the substrate. They interconnect the plurality of circuits 12. Each of the plurality of polysilicon lines 14(a–n) has a second end 20 and a first end 22 with substantially the same length between the first end 22 and the second end 20 with electrical signals traversing from the second end 20 to the first end 22.

In the preferred embodiment, the integrated circuit device 10 is a memory device in which the plurality of circuits 12 are row decoders. The plurality of polysilicon lines 14(a–n) are word lines or row lines. The semiconductor integrated circuit device 10 can be a volatile memory device such as a DRAM or an SRAM or can be a non-volatile memory device such as a FLASH memory device or an EEPROM device.

Figure 2A:
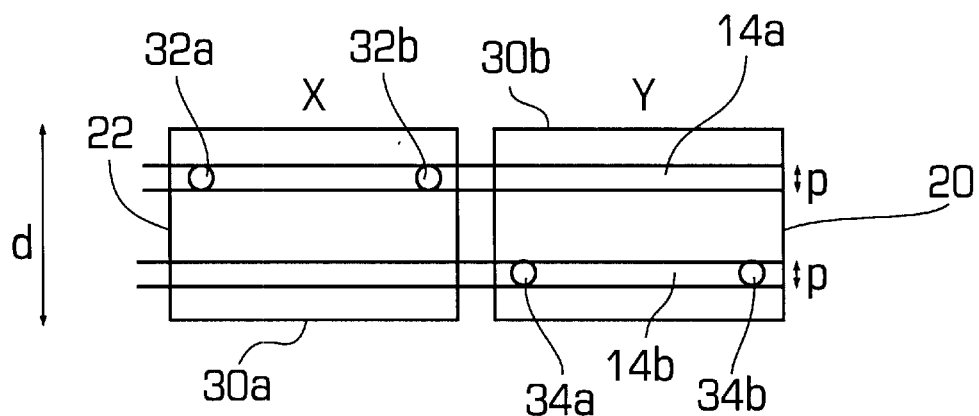
FIG. 2A is a top view of one embodiment of the present invention in which a metal line partially straps two polysilicon lines.
Figure 2B:
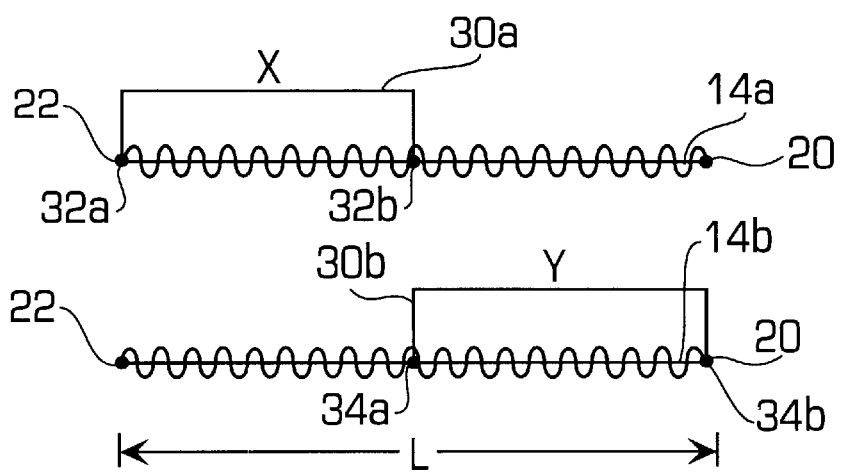
FIG. 2B is a schematic view of the embodiment shown in FIG. 2A.
Figure 2C:
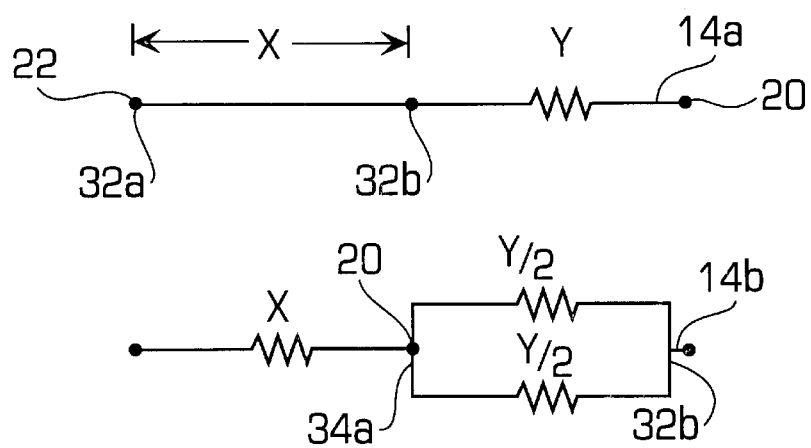
FIG. 2C is an equivalent circuit of the invention shown in FIG. 2A.

Referring to FIGS. 2A–2C, there is shown one embodiment of the present invention in which a single metal line 30 is used to strap two adjacent spaced-apart polysilicon lines 14a and 14b. The metal line 30 comprises two spaced apart segments 30A and 30B that are collinear and have a width of a dimension d. As previously stated, each of the polysilicon lines 14a and 14b has a first end 22 and a second end 20 and a length therebetween with each having a width of a dimension P, with P less than d. In fact, d overlaps the distance between the two polysilicon lines 14a and 14b as well as including their widths P.

As previously stated, the metal line 30 has two segments 30a and 30b having a length of x and y respectively. Each of the lengths x and y is used to strap or is connected to a different one of the polysilicon lines 14a or 14b. Thus, the metal segment 30a is used to strap polysilicon line 14a through via holes 32a and 32b. The metal segment 30b is used to strap polysilicon line 14b through the via holes 34a and 34b.

Schematically this is shown in FIG. 2b. Polysilicon line 14a extends from the first end 22 to the second end 20 through a line having resistivity as shown by the waviness of the line in FIG. 2b. However, between the via holes 32a and 32b, the metal segment 30a having a length of x straps the polysilicon line 14a. There is essentially no resistance between the location of the via hole 32a and 32b.

Similarly, the polysilicon line 14b is shown as being "wavy" indicating that it has a resistivity between the first end 22 and the second end 20. However, between the via hole 34a and 34b the metal segment 30b having a length of y is used to strap the polysilicon line 14b.

Referring to FIG. 2C there is shown a schematic circuit diagram of the strapping shown in FIG. 2a. For the polysilicon line 14a, there is essentially zero resistivity between via hole 32a and 32b. Thereafter, between the via hole 32b and the second end 20, the resistivity is y which is the length of the polysilicon 14A which is not strapped. Thus, if a signal were to propagate from the second end 20 to the first end 22, it would encounter a resistivity path of length y followed by zero resistance. A similar analysis of the polysilicon line 14b shows that near the first end 22, of a distance x, the polysilicon line 14b has a resistivity of x. However, near the second end 20, if the signal were generated at a point midway between the two via holes 34a and 34b, it would encounter the maximum amount of resistivity, namely it would have to traverse through a resistance of y/2 to reach a node 34a from which then it encounters the resistivity of x. In short, in the segment between the via hole 34a and 34b, the equivalent circuit is that shown in FIG. 2C of two resistors each having y/2 connected in parallel.

Because for both of these polysilicon lines 14a and 14b, the signal propagation time between the second end 20 and the first end 22 must be the same, one can set up the following equations.

1) $x+y=L$  L is the length of polysilicon lines 14a or 14b.

2) $y+o=$time of propagation of signal on line 14a

3) $x+y/4=$time of propagation of signal on line 14b

Since equation 2=3

4) $y+o=X+y/4$

5) $X=3/4 y$

Substituting into equation (1) yields

6) $3/4 y+y=L$

7) $y=4/7 L$

8) $x=3/7 L$

In other words, metal segment 30a is not the same length as metal segment 30b.

Figure 3A:
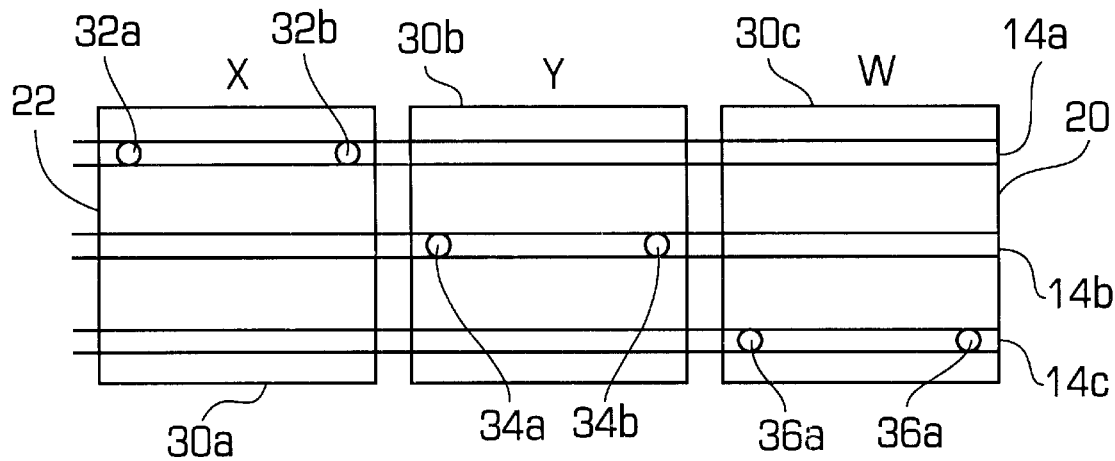
FIG. 3A is a top view of another embodiment of the present invention in which a metal line partially straps three polysilicon lines.
Figure 3B:
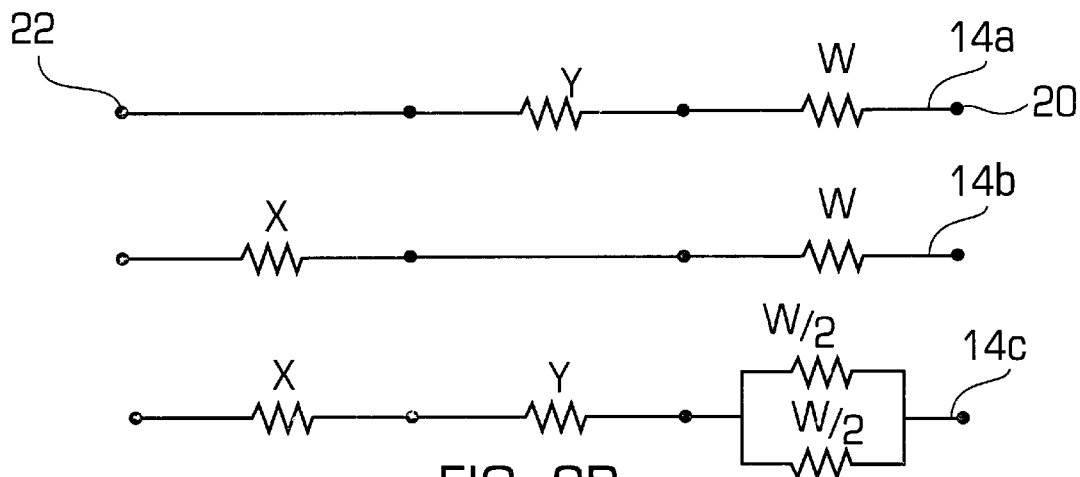
FIG. 3B is an equivalent circuit view of the invention shown in FIG. 3A.

Referring to FIG. 3a, there is shown the method and apparatus of the present invention used to strap three polysilicon lines 14a, 14b and 14c. Similar to the discussion for the invention as applied to two polysilicon lines shown in FIG. 2a, the metal line 30 used to strap three polysilicon lines 14a, 14b and 14c comprises three segments 30a, 30b and 30c each having lengths x, y and w respectively. Metal segment 30a connects to polysilicon line 14a at via holes 32a and 32b and has a length x. Metal segment 30b connects to the polysilicon line 14b at via holes 34a and 34b and has the length y. Metal segment 30c connects to the polysilicon line 14c at via holes 36a and 36b and has a length w. The metal segments 30a, 30b and 30c are spaced apart from one another but are collinear. Using the same analysis as done for the invention shown and described in FIG. 2a, the invention as used and applied to three polysilicon lines 14a, 14b and 14c may be schematically shown as in FIG. 3b. Similar to the previous discussion, for the polysilicon line 14a, the signal propagating from the second end 20 to the first end 22 passes through a resistivity network comprising of resistance W and Y. For the polysilicon line 14b, the signal propagating from the second end 20 to the first end 22 passes through resistance of W and X. For the polysilicon line 14c, the signal line propagating from the second end 20 to the first end 22 passes through a network comprising of two resistors each with resistance W/2 connected in parallel, then in series with resistors X and Y. Since the signal propagation time for all three must be equal, one can solve the following equations and determine the optimal lengths for X, Y and W as follows:

9) $x+y+w=L$  L is the length of polysilicon lines 14a, 14b or 14c.

10) $w+y+o=$time of propagation of signal on line 14a.

11) $w+o+x=$time of propagation of signal on line 14b

12) $w/4+y+x=$time of propagation of signal on line 14c.

Equations (10), (11) and (12) must all be equal. Solving equation (10) and (11), one obtains:

13) $x=y$

From this substituting into equations (10) and (12) one finds:

14) $w=1/3 y$

Substituting (13) and (14) into equation (9) yields:

$x=y=3/10 L$ $w=4/10 L$

Finally, one can "generalize" the case of partial strapping involving a single collinear metal line having a plurality of spaced apart metal segments partially strapping a plurality of polysilicon lines with each metal segment strapping a different polysilicon line, as follows:

15) $a+b+ \ldots +n-1+x=L$ L is the length of polysilicon lines 14a, 14b . . . 14n.

16) $o+b+ \ldots +x$ time of propagation of signal on line 14a.

17) $a+o+c+ \ldots +=$time of propagation of signal on line 14b.

18) $a+b+o+d+ \ldots +x=$time of propagation of signal on line 14c.

Four equations 16–18 . . . it can be shown that

(19) $a=b=c=d= \ldots =n-1$

Finally, it can be shown that $$20)\ a=b=c=d=\ldots n-1=\frac{L}{n+1/3},$$

n is the number of lines and

21) $x^{1}/3 a$, x is the segment closest to the second end 20.

As can be seen from the foregoing, each of the above examples, including the generalized example shows that in the case of partial strapping, the positioning of the metal segments and the lengths of the metal segments used in partial strapping is asymmetrical which is contrary to "intuitive" belief.

What is claimed is:

1. A semiconductor integrated circuit device comprising:

a semiconductor substrate;

a plurality of circuits in said semiconductor substrate;

a plurality of substantially parallel, laterally adjacent spaced part polysilicon lines, insulated from said substrate and interconnecting said plurality of circuits; each of said plurality of polysilicon lines having a first end and a second end and having substantially the same length between said first end and said second end with electrical signals traversing from said second end to said first end;

a plurality of substantially collinear metal lines, spaced apart from said plurality of polysilicon lines;

each of said plurality of metal lines for electrically connecting to a different one of said plurality of polysilicon lines;

said metal lines arranged from said first end to said second end, with each metal line having a length of $$x = \frac{L}{n + 1/3}$$

and with the metal line at said second end having a length of ⅓X where L is the length between said first end and said second end, and n is the number of metal lines.

2. The device of claim 1 wherein said integrated circuit device is a memory device.

3. The device of claim 2 wherein said plurality of polysilicon lines are row lines.

4. The device of claim 1 wherein the number of plurality of metal lines is two (2) and the lengths of the metal lines are $x_1 = 3/7L$; $X_2 = 1/7L$ with $X_2$ being the metal line at said second end.

5. The device of claim 1 wherein the number of plurality of metal lines is three (3) and the lengths of the metal lines are $X_1 = 3/10L$; $X_2 = 3/10L$; $X_3 = 1/10L$ with $X_3$ being the metal line at said second end.

6. The device of claim 3 wherein said device is a volatile memory device.

7. The device of claim 6 wherein said device is a DRAM.

8. The device of claim 6 wherein said device is a SRAM.

9. The device of claim 3 wherein said device is a non-volatile memory device.

10. The device of claim 9 wherein said device is a flash memory device.

11. A method of strapping a plurality of parallel laterally adjacent, spaced apart, polysilicon lines, insulated from a semiconductor substrate, wherein each of said plurality of polysilicon lines has a first end and a second end with substantially the same length with signals traversing from said second end to said first end; said method comprising:

connecting a plurality of substantially collinear metal lines to said plurality of polysilicon lines; each metal line electrically strapping a different one of said plurality of polysilicon lines; said metal lines arranged from said first end to said second end with each metal line having a length of $$X = \frac{L}{n + 1/3}$$

and having a length of ⅓X where L is the length between said first end and said second end, and n is the number of metal lines.

12. The method of claim 11 wherein the number of plurality of metal lines is two (2) and the lengths of the metal lines are $X_1 = 3/7L$ and $X_2 = 1/7L$ with X2 being the metal line at said second end.

13. The method of claim 11 wherein the number of plurality of metal lines is three (3) and the lengths of the metal lines are $X_2 = 3/10L$; $X_2 = 3/10L$ and $X_3 = 1/10L$ with $X_3$ being the metal lines at said second end.

* * * * *